(12) United States Patent
Cheng et al.

(10) Patent No.: US 7,912,383 B2
(45) Date of Patent: Mar. 22, 2011

(54) CONFIGURABLE POST-AMPLIFIERS THAT ARE CAPABLE OF BEING CONFIGURED TO PERFORM EITHER SUBSTANTIALLY LINEAR OR LIMITING AMPLIFICATION FOR USE IN OPTICAL RECEIVERS

(75) Inventors: Hengju Cheng, Mountain View, CA (US); Christine Krause, Boulder Creek, CA (US)

(73) Assignee: Intel Corporation, Santa Clara, CA (US)

( * ) Notice: Subject to any disclaimer, the term of this patent is extended or adjusted under 35 U.S.C. 154(b) by 896 days.

(21) Appl. No.: 11/647,844

(22) Filed: Dec. 29, 2006

(65) Prior Publication Data
US 2008/0159756 A1   Jul. 3, 2008

(51) Int. Cl.
*H04B 10/06* (2006.01)

(52) U.S. Cl. ........ 398/210; 398/208; 398/135; 398/136; 330/59; 330/308; 250/214 A; 250/214 AG

(58) Field of Classification Search .............. 398/202, 398/208, 209, 210, 213, 214, 135, 128, 139, 398/136, 137, 138, 164, 158, 159, 160; 330/59, 330/308; 250/214 A, 214 AG, 214 LA, 214 R, 250/214 C
See application file for complete search history.

(56) References Cited

U.S. PATENT DOCUMENTS

| | | | |
|---|---|---|---|
| 6,775,631 | B2 | 8/2004 | Van Schyndel |
| 7,092,644 | B2* | 8/2006 | Davidson ............... 398/202 |
| 7,242,871 | B2* | 7/2007 | Huang et al. ........... 398/210 |
| 7,365,665 | B2* | 4/2008 | Pease .................... 341/139 |
| 6,928,249 | B2 | 8/2008 | Robinson |
| 2002/0135845 | A1 | 9/2002 | Robinson et al. |
| 2005/0195038 | A1 | 9/2005 | Neenan et al. |
| 2006/0067712 | A1* | 3/2006 | Draper et al. .......... 398/208 |
| 2006/0093379 | A1* | 5/2006 | Aronson ................ 398/208 |
| 2007/0104494 | A1* | 5/2007 | Murayama ............. 398/202 |

OTHER PUBLICATIONS

PCT Search Report, and Written Opinion , "PCT/US2007/089071", (Jun. 4, 2008), 10 pages.
Intel Corporation, "Intel TXN31115, 4/2/1 Gbps Small Form Factor Pluggable Optical Transceivers", *Product Brief*, Order No. 300464-003, (2005), 4 pages.
Intel Corporation, "Optical Technoligies and Applications", *Intel Technology Journal*, vol. 08, Issue 02, ISSN 1535-864X, (May 10, 2004), pp. 73-171.

* cited by examiner

*Primary Examiner* — Hanh Phan
(74) *Attorney, Agent, or Firm* — Blakely, Sokoloff, Taylor & Zafman LLP

(57) ABSTRACT

Configurable amplifiers for optical receivers and transceivers are disclosed. In one aspect, a configurable amplifier may be coupled with an output of a current-to-voltage converter to receive a voltage. The configurable amplifier may be capable of being configured to use either a substantially linear amplifier portion or a substantially non-linear amplifier portion to amplify the voltage.

24 Claims, 7 Drawing Sheets

US 7,912,383 B2

CONFIGURABLE POST-AMPLIFIERS THAT ARE CAPABLE OF BEING CONFIGURED TO PERFORM EITHER SUBSTANTIALLY LINEAR OR LIMITING AMPLIFICATION FOR USE IN OPTICAL RECEIVERS

BACKGROUND

1. Field

Embodiments of the invention relate to the field of optical receivers. In particular, embodiments of the invention relate to signal amplification for optical receiver applications.

2. Background Information

Optical transceivers may be used to exchange data rapidly over optical fibers. However, optical dispersion may be introduced into the optical signals transmitted over the optical fibers. The amount of optical dispersion tends to increase with increasing transmission distance. The amount of optical dispersion may also vary with fiber type. A significant amount of optical dispersion may tend to hinder accurate recovery of the data represented by the optical signals.

Electronic dispersion compensation (EDC) is one known technique that may be used to reduce optical dispersion. However, optical receivers commonly include a so-called limiting post-amplifier to amplify the voltage output by a transimpedance amplifier (TIA). In addition to amplifying the voltage, the limiting post-amplifiers may tend to remove the upper and/or lower extents of the incoming signal or otherwise alter the shape of the received optical signals. Such alteration of the shape of the received optical signals may tend to hinder the ability of EDC to compensate for optical dispersion.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description.

Figure 1:
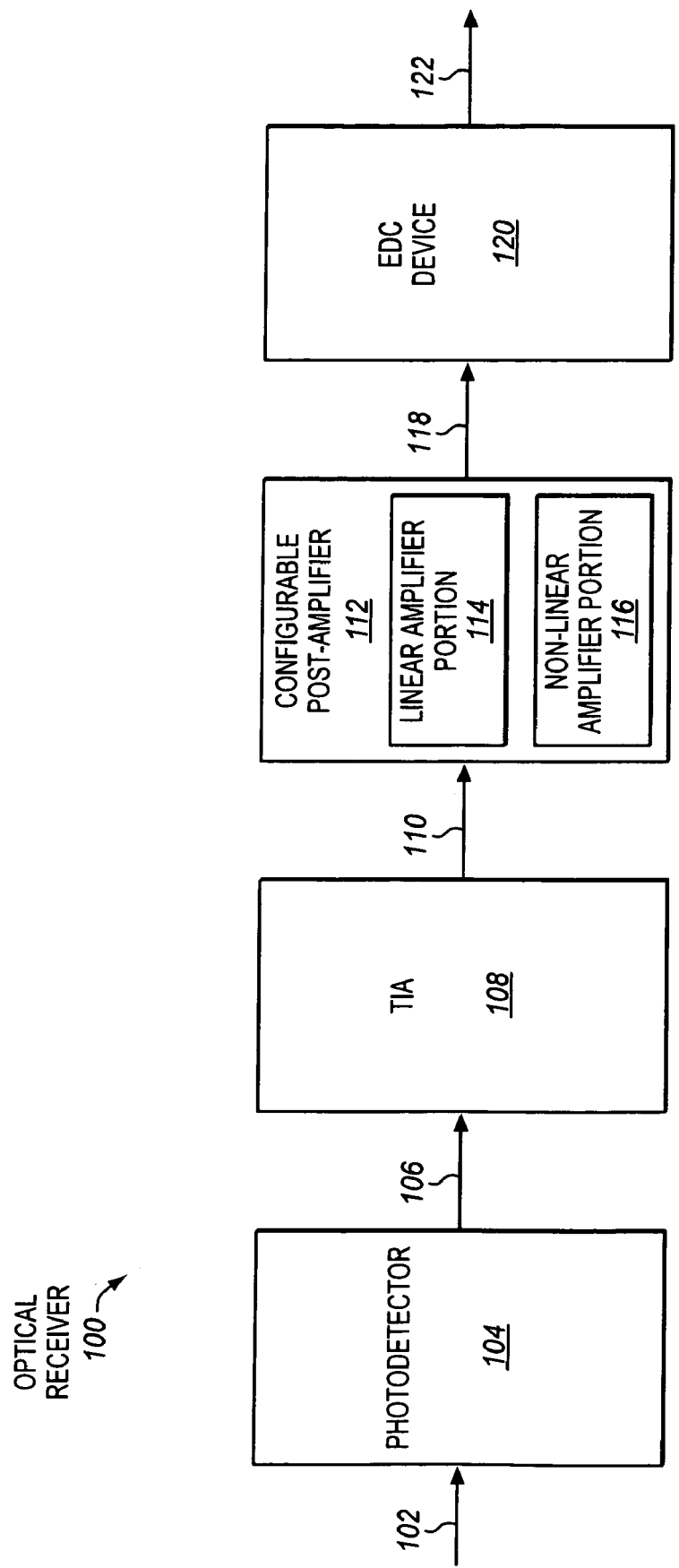
FIG. 1 is a block diagram of an optical receiver, according to one or more embodiments of the invention.

FIG. 1 is a block diagram of an optical receiver 100, according to one or more embodiments of the invention. The optical receiver includes a configurable post-amplifier, according to one or more embodiments of the invention, which will be discussed further below.

The optical receiver includes a photodetector 104. Examples of suitable photodetectors include, but are not limited to, avalanche photodiodes (APDs), positive-intrinsic-negative (PIN) photodiodes, and other photodetectors known in the arts. The photodetector and/or the optical receiver may be optically coupled with one or more optical fibers, other optical waveguides, or other optical transmission medium (not shown). The photodetector may receive light 102 as input from the optical transmission medium. The photodetector may detect the light and generate a corresponding electrical current 106.

The optical receiver also includes the transimpedance amplifier (TIA) 108. The TIA is electrically coupled with an output of the photodetector. The TIA may receive the electrical current 106 from the photodetector as an input. The TIA may include an electronic circuit or other device that is capable of performing current-to-voltage transformation or conversion. As such, the TIA may also be referred to herein as a current-to-voltage converter or current-controlled voltage source. The TIA may convert or transform the electrical current received from the photodetector to a corresponding voltage 110. In one or more embodiments of the invention, the TIA may include a substantially linear TIA to convert a current to a voltage that is directly proportional or substantially directly proportional to the current, although the scope of the invention is not limited in this respect. Substantially linear TIAs are specified in the IEEE standard 802.3aq 10GBASE-LRM as not distorting the incoming signal to a higher TWDP than can be corrected by the EDC chip. The TIA may provide the voltage as an output. An example of a suitable substantially linear TIA that is commercially available is Phy1090, which is commercially available from Phyworks, of Bristol, United Kingdom, although others known in the arts may instead optionally be used.

The optical receiver also includes the configurable post-amplifier 112. The "post-" is optionally used to clarify or designate that the configurable post-amplifier performs amplification after the TIA. The configurable post-amplifier is electrically coupled with an output of the TIA or current-to-voltage converter.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, the configurable post-amplifier may be electrically coupled with the TIA through one or more intervening components, such as, for example, conductive paths on a circuit board or AC-blocking capacitors.

The configurable post-amplifier may receive the voltage 110 from the TIA or current-to-voltage converter. The configurable post-amplifier includes a substantially linear amplifier circuit or portion 114 and a substantially non-linear amplifier circuit or portion 116. The configurable post-amplifier may be capable of being configured to use either the substantially linear amplifier portion or the substantially non-linear amplifier portion to amplify the voltage received from the TIA or current-to-voltage converter. The amplified voltage 118 may be provided as output.

The substantially linear amplifier circuit or portion may have an output signal or voltage that is amplified directly proportionally, or at least substantially directly proportionally, relative to an input signal or voltage. It is this characteristic that the response or output is directly proportional to the input that makes the amplifier substantially linear. In practice, imperfect electronics, transistor non-linearity and leakage, design approximations, and other factors may tend to make the linear amplifier slightly not perfectly linear in amplification. The term "substantially linear" is intended to allow for such slight deviations from linearity typically observed in such linear amplifiers. In one or more embodiments of the invention, substantially linear means a total harmonic distortion of less than 4% over the input operating current range. The output voltage from the substantially linear post-amplifier portion may also be referred to as a substantially linearly amplified voltage. The substantially linear amplified voltage signal may preserve the pulse shape of the input signal, as opposed to a signal amplified by a standard limited amplifier, which may facilitate electronic dispersion compensation as explained further below.

In contrast, the substantially non-linear amplifier circuit or portion may have an output signal or voltage that is not amplified directly proportionally, or substantially directly proportionally, relative to an input signal or voltage. In one or more embodiments of the invention, the non-linear amplifier portion may include a limiting post-amplifier circuit or portion, such as, for example, one of those commonly used in optical transceivers, although the scope of the invention is not so limited. The limiting post-amplifier portion may occasionally be known in the arts as a one-bit quantizer. In a limiting amplifier, the upper and lower extremes of the signal may be removed, or the shape of the signal may be otherwise altered substantially more than would be the case for the substantially linear post-amplifier.

The illustrated optical receiver may or may not also include an optional electronic dispersion compensation (EDC) circuit or other device 120. The EDC device is electrically coupled with an output of the configurable post-amplifier. The EDC device may receive the amplified voltage, or at least the substantially linearly amplified voltage, from the configurable post-amplifier. The EDC device may perform electronic dispersion compensation on the substantially linearly amplified voltage.

The substantially linear amplification of the voltage generally preserves the signal shape and other characteristics so that the EDC device may help to compensate for the fiber dispersion component of the voltage. This compensation may help to open the eye-diagram and better allow the incoming data to be recovered. Advantageously, the linear amplification and EDC may allow link distance to be extended. By way of example, in one particular implementation, it is contemplated that the linear amplification and EDC may allow the link distance to be extended from around 70 m to around 100 m for an 850 nm transceiver on the installed fiber base, although the scope of the invention is not limited in this respect. In contrast, traditional limiting amplification may not allow EDC to achieve equalization, eye opening, or link extension to the same extent.

Various suitable EDC techniques are well known in the art, and will not be described in detail, in order to avoid obscuring this description. Furthermore, embodiments of the invention are not limited to EDC. Optical dispersion compensation or software dispersion compensation are examples of alternatives to EDC.

Figure 2:
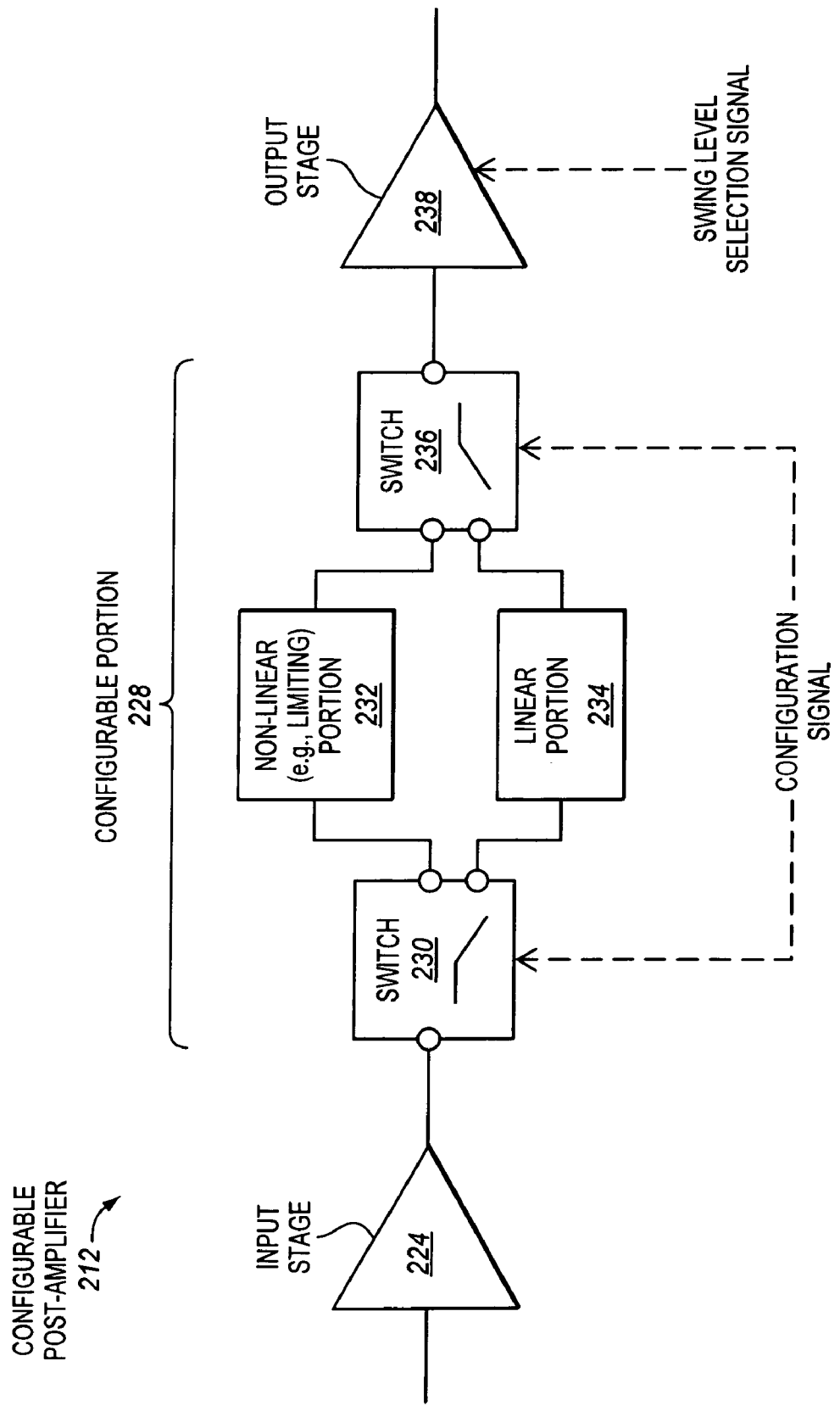
FIG. 2 is a block diagram of a particular example of a configurable post-amplifier, according to one or more embodiments of the invention.

FIG. 2 is a block diagram of a particular example of a configurable post-amplifier 212, according to one or more embodiments of the invention. This particular example is to be construed as illustrative, rather than limiting.

The configurable post-amplifier includes an input stage 224, a first switch 230, a substantially non-linear amplifier circuit, branch, or other portion 232, a substantially linear amplifier circuit, branch, or other portion 234, a second switch 236, and an output stage 238.

The input stage 224 may be electrically coupled with a TIA or other current-to-voltage converter. The input stage may act as a buffer with impedance matching and may or may not perform a minimal amount of amplification. The input stage may also have an input offset adjustment. In one particular example embodiment, the input stage may include a CMOS or bipolar differential pair with about a 100 Ohm differential input termination, or two separate 50 Ohm input terminations, although the scope of the invention is not so limited.

A configurable portion 228 includes the first switch 230, the second switch 236, the substantially non-linear amplifier portion 232, and the substantially linear amplifier portion 234. The first switch is electrically coupled with an output of the input stage. The substantially non-linear amplifier portion and the substantially linear amplifier portion are each electrically coupled with a different, selectable output of the first switch. The second switch has different, selectable electrically couplings with each of the substantially non-linear amplifier portion and the substantially linear amplifier portion. The first and second switches may be configured to select either the substantially linear amplifier portion or the substantially non-linear amplifier portion. In one or more embodiments of the invention, the switches may not add substantial non-linearity.

In one configuration, the first and second switches may create an electronic path through the substantially non-linear amplifier portion. In one or more embodiments of the invention, the non-linear amplifier portion may include a standard limiting amplifier portion. By way of example, the limiting amplifier portion may have a gain of more than thirty times that of the input, although this may depend upon the implementation and the scope of the invention certainly is not limited to such a gain.

In another configuration, the first and second switches may create an electronic path through the substantially linear amplifier portion. In the illustration, the latter configuration is shown. Accordingly, the first and second switches in the illustrated embodiment represent signal path switches. It should be appreciated that the scope of the invention is not limited to two switches. In other embodiments, fewer or more switches may optionally be used.

The configurable portion and/or the first and second switches may be configured by a configuration signal. As shown, the configuration signal may be provided to each of the first and second switches. The configuration signal may indicate either to allow the non-linear amplifier portion to amplify the voltage or to allow the non-linear amplifier portion to amplify the voltage. By way of example, in one or more embodiments, a controller may provide the configuration signal, although other ways of providing the selection signal are also possible.

The output stage 238 is electrically coupled with the output of the second switch. The output stage may provide a minimal amount of gain and may help to match the output termination impedance to the output transmission line. In one particular example embodiment, the output stage may include a CMOS or bipolar differential pair with about a 50 to 100 Ohm differential, although the scope of the invention is not so limited.

In one or more embodiments of the invention, a swing level of the output stage may optionally be configurable or selectable, although this is not required. As shown, a swing level selection signal may be provided to the output stage, such as, for example, from a controller. The swing level selection may potentially depend upon the configuration of the amplifier, although this is not required.

In one or more embodiments of the invention, an output of the output stage may be electrically coupled with an EDC device. As previously mentioned, the substantially linear amplification of the voltage generally preserves the signal characteristics so that the EDC device may help to compensate for the fiber dispersion component of the voltage. This compensation may help to open the eye-diagram and better allow the incoming data to be recovered. Advantageously, the linear amplification and EDC may allow link distance to be extended. Such compensation, eye opening, or link extension may not be achievable to the same extent if only limiting amplification is performed in combination with EDC.

The configurable post-amplifiers disclosed herein may be configured at different times, for different reasons, and in different ways. In one or more embodiments of the invention, the configurable post-amplifiers may be configured during manufacture prior to sale. As another option, in one or more embodiments of the invention, a purchaser and user may configure the configurable post-amplifiers. In one or more embodiments of the invention, the configurable post-amplifiers may optionally be re-configured after initial use, such as, for example, when their use changes or to suit a different use.

In one or more embodiments of the invention, the configurable post-amplifier may be configured based, at least in part, on knowledge of one or more of: (1) a link distance to be used for an optical transceiver incorporating the configurable amplifier; and (2) a dispersion characteristic of one or more optical fiber to be used to convey light to the optical transceiver incorporating the configurable amplifier. By way of example, the configurable post-amplifier may be configured to use the linear amplifier for an implementation involving long link distances and/or poor quality legacy optical fiber having relatively high dispersion. Alternatively, the configurable post-amplifier may be configured to use a limiting amplifier for an implementation involving short link distances and/or high quality multi-mode optical fiber.

One potential advantage of the configurable post-amplifier is that it may allow a single integrated circuit including the configurable post-amplifier to be manufactured and later configured to suite different implementations or objectives, instead of manufacturing multiple different integrated circuits. Rather than manufacturing multiple separate configurable post-amplifier chip designs, a single chip design may be manufactured and then configured according to the particular implementation.

Figure 3A:
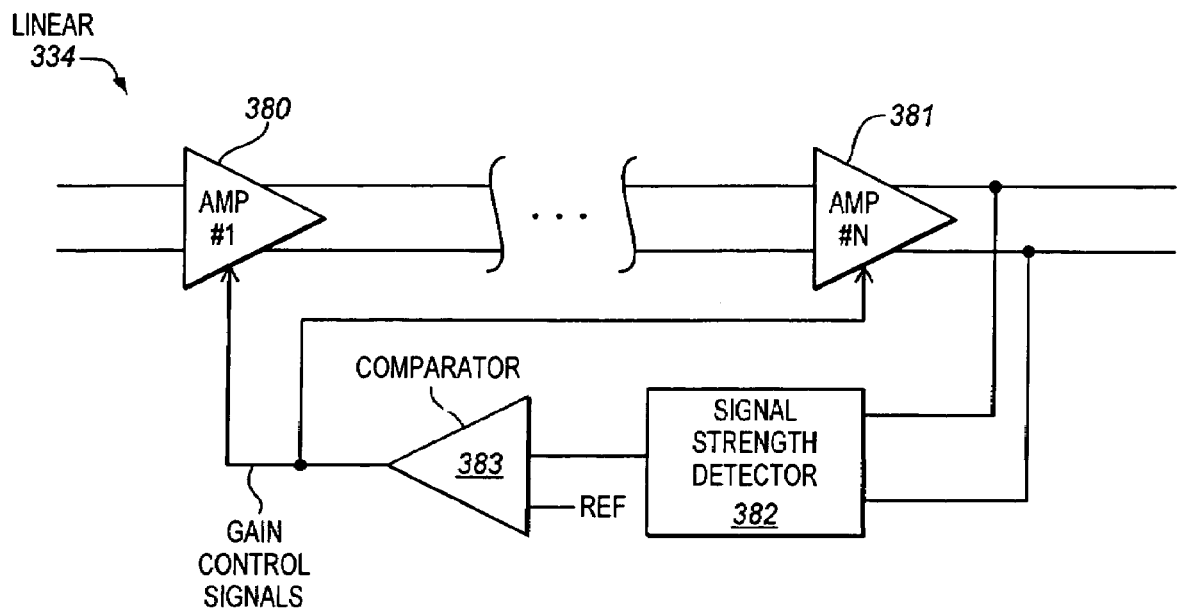
FIG. 3A is a block diagram of a particular example of a substantially linear post-amplifier circuit, branch, or portion, according to one or more embodiments of the invention.

FIG. 3A is a block diagram of a particular example of a substantially linear post-amplifier circuit, branch, or portion 334, according to one or more embodiments of the invention. The substantially linear post-amplifier circuit includes a plurality of amplification stages. A first amplification stage 380 and an Nth amplification stage 381 are shown, although others may optionally be included. The input of the first amplification stage may be coupled with the output of the first switch 230, and the output of the Nth amplification stage may be coupled with the input of the second switch 236. The number of amplification stages may be fixed and may depend upon the particular implementation. The stages are differential. Each of the amplification stages may include an automatic gain control amplifier or other variable amplifier. A signal strength detector 382 may sample and detect the output signal strength from the substantially linear post-amplifier circuit. The signal strength detector may provide the signal strength to a comparator 383. The comparator may also receive a reference (ref) signal strength. The comparator may compare the detected signal strength with the reference signal strength and may issue corresponding gain control signals to the amplification stages. These signals may set the amplification gain of the stages. An alternate substantially linear post-amplifier circuit, branch, or portion is also contemplated to omit automatic gain control amplifiers and just have a lower amount of gain than a limiting amplifier with the gain linear over the input range without clipping.

Figure 3B:
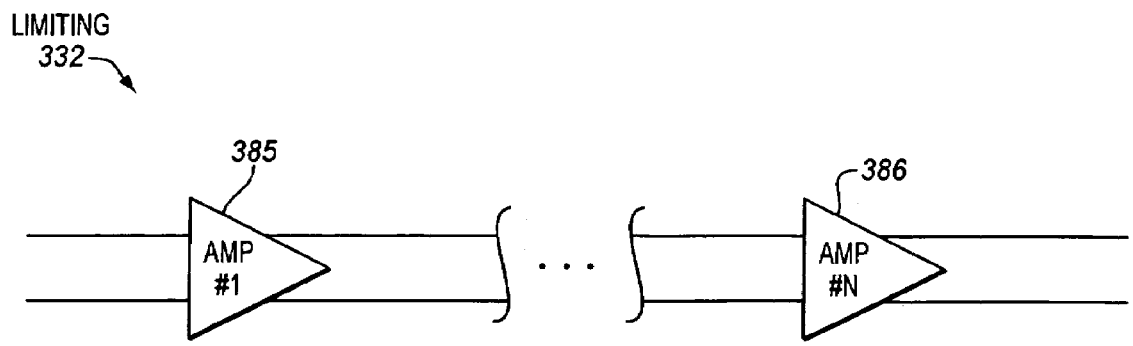
FIG. 3B is a block diagram of a particular example of a substantially limiting (e.g., a particular non-linear) post-amplifier circuit, branch, or portion, according to one or more embodiments of the invention.

FIG. 3B is a block diagram of a particular example of a substantially limiting post-amplifier circuit, branch, or portion 332, according to one or more embodiments of the invention. The limiting post-amplifier circuit is one example of a suitable non-linear portion. The limiting post-amplifier circuit includes a first amplification stage 385 and an Nth amplification stage 386, although others may optionally be included. The number of amplification stages may be fixed and may depend upon the particular implementation. The stages are differential. The input of the first amplification stage may be coupled with the output of the first switch 230, and the output of the Nth amplification stage may be coupled with the input of the second switch 236. The gain at each amplification stage may be fixed and may depend upon the particular implementation.

Figure 4:
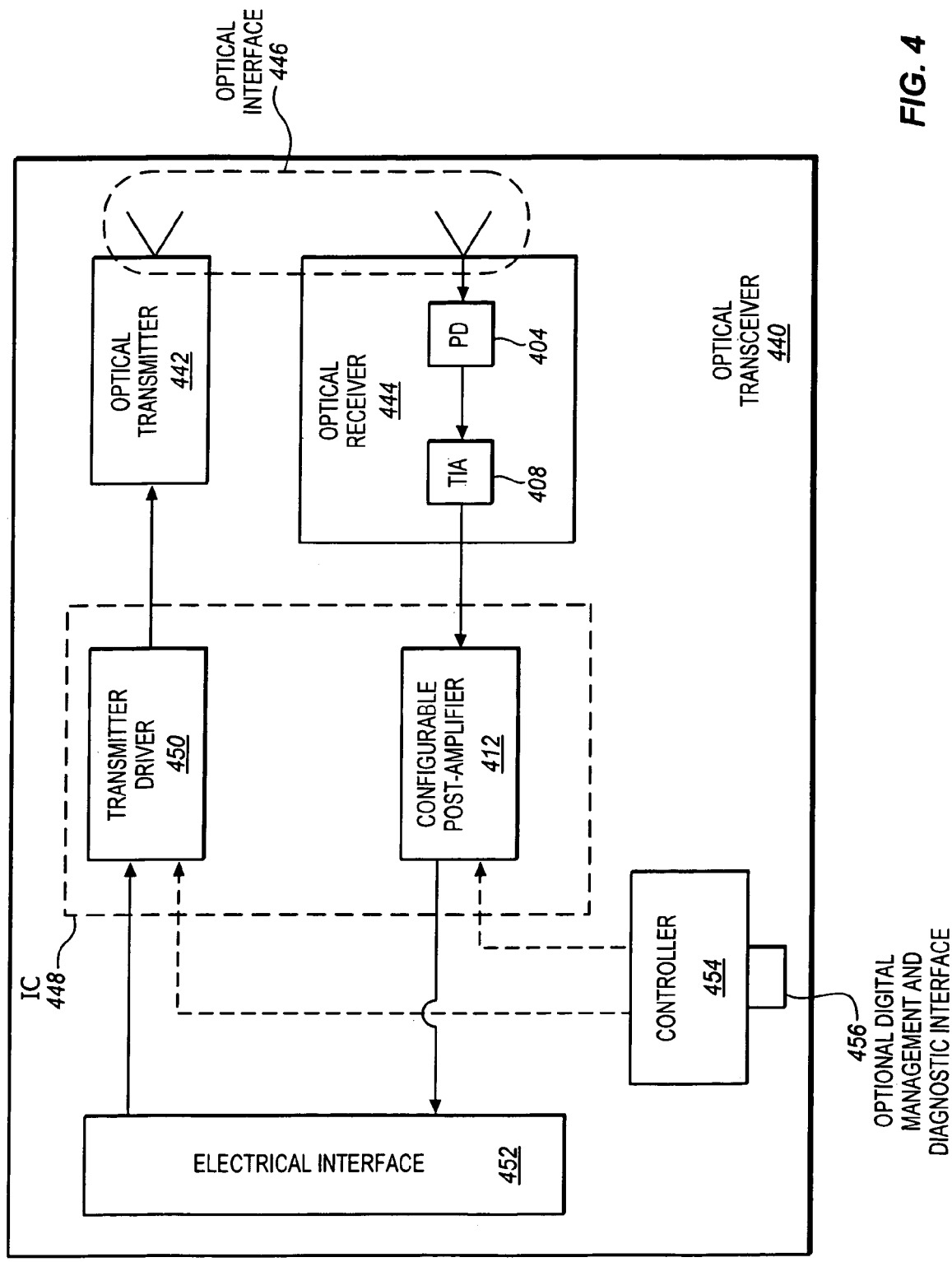
FIG. 4 is a block diagram of a particular example of an optical transceiver suitable for implementing one or more embodiments of the invention.

FIG. 4 is a block diagram of a particular example of an optical transceiver 440 suitable for implementing one or more embodiments of the invention. This particular example is to be construed as illustrative, rather than limiting.

The optical transceiver includes an optical transmitter 442 and an optical receiver 444. Since the optical transceiver includes an optical receiver, it may also be considered an optical receiver. The optical transmitter and the optical receiver provide an optical interface 446. One or more optical fibers or another suitable optical transmission medium (not shown) may be optically and/or physically coupled with the optical interface. The optical transmitter may transmit optical signals through the optical interface. The optical receiver may receive optical signals through the optical interface. As shown, the optical receiver includes a photodetector (PD) 404 and a transimpedance amplifier (TIA) 408. The photodetector and TIA may have characteristics and performance similar to those previously described.

It is worth noting that one potential advantage of the configurable post-amplifier is an ability to shift a portion of the linear gain from the TIA to the configurable post-amplifier. This may help to reduce power dissipation limitations of the TIA, which may help to improve TIA sensitivity. In the case of TO-CAN and certain other types of packaging, the power dissipation may be somewhat limited.

In one or more embodiments of the invention, the optical transmitter may be packaged or assembled to form an optical transmitter package or assembly known as a Transmitter Optical Sub-Assembly (TOSA). Likewise, in one or more embodiments of the invention, the optical receiver may be separately packaged or assembled to form an optical receiver package or assembly known as a Receiver Optical Sub-Assembly (ROSA). The packages or assemblies may optionally have hermetic seals. However, the scope of the invention is not limited in this respect.

The optical transmitter and the optical receiver are each separately electrically coupled with an integrated circuit (IC) 448. Alternatively, more than one integrated circuit may optionally be used. The integrated circuit may include circuits or logic to provide much or most of the core electrical processing functionality of the transceiver.

Representative examples of functionalities that may be supported by the integrated circuit according to various embodiments of the invention, include, but are not limited to, those of clock multiplier/multiplexer (MUX/CMU), clock and data recovery/demultiplexer (CDR/DeMUX), other MUX/DeMUX capabilities, phase adjustment, co-alignment, line de-skewing, decoding, rate adjustment, scrambling, encoding, serialization, deskew, and de-serialization, electrical and optical loopback, and other functionalities associated with physical medium attachment (PMA), and/or other functionalities associated with optical transceivers. In other embodiments of the invention, various of these functionalities may be included in another circuit on a printed circuit board, mother board, or line card, instead of in the aforementioned integrated circuit. To avoid obscuring the description, these capabilities are not described in detail herein, since they may be implemented substantially conventionally if desired.

The illustrated integrated circuit includes a transmitter driver 450, and a configurable post-amplifier 412. Accordingly, the transmitter driver and the configurable post-amplifier are capable of being electrically coupled with the optical transmitter and the TIA, respectively, by coupling the integrated circuit to a printed circuit board of the optical transceiver having the optical transmitter and the optical receiver having the TIA coupled thereto. The transmitter driver may drive the optical transmitter to transmit optical signals. The configurable post-amplifier may have characteristics and performance similar to those previously described.

The integrated circuit is electrically coupled with an electrical interface 452. In particular, the transmitter driver is electrically coupled with the electrical interface at least to receive electrical signals therefrom, and the configurable post-amplifier is electrically coupled with the electrical interface at least to provide electrical signals thereto. As another option, one or more other components, such as, for example, an EDC device, may optionally be disposed between the configurable post-amplifier and the electrical interface.

The electrical interface may be physically and/or electrically coupled with a host electronic device, such as, for example, a switch, router, server, or other network device. The electrical interface may exchange electrical signals with the host electronic device. Representative signals that may be exchanged include, but are not limited to, input/output data transfer, various clocking channels, control and monitoring channels, and DC power and ground connections. However, the scope of the invention is not limited with regard to these electrical signals. Examples of suitable physical forms of the electrical interface include, but are not limited to, a socket that may plug into a host board and a board-edge connection that may mate with a socket in a host board. In one or more embodiments of the invention, the optical transceiver may be used for fiber channel or high-speed Ethernet applications, such as, for example, 10 Gigabits per second Ethernet, although the scope of the invention is not so limited. In various embodiments of the invention, the interface may include an XAUI interface (10 Gigabit. Attachment Unit Interface) or a XFI interface (10 Gigabit Serial Electrical Interface), such as, for example, in order to provide data rates of about 10 Gb/s, according to different multi-source agreements.

The optical transceiver also includes a controller 454. The controller is electrically coupled with the integrated circuit 448. In particular, the controller is electrically coupled with the transmitter driver and the configurable post-amplifier. The microcontroller may provide a control system for the optical transceiver. By way of example, the microcontroller may perform functions, such as, for example, setting control parameters for optical transmission and optical reception. Aside from such relatively standard control functions, the controller may also optionally provide a configuration signal to configure the configurable post-amplifier as previously described. For example, in one or more embodiments of the invention, the controller may have a storage location, such as, for example, an EEPROM or other register or memory location, which may store a configuration for the configurable post-amplifier. The controller may provide a control signal to the configurable post-amplifier based on the configuration stored in the storage location.

One example of a suitable controller is C8051F125, which is commercially available from Silicon Laboratories, of Austin, Tex. Another example of a suitable controller is Atmega168, which is commercially available from Atmel Corporation, of San Jose, Calif.

As shown, in one or more embodiments of the invention, the controller may optionally be electrically coupled with a digital management and diagnostics interface 456. The digital management and diagnostics interface, which is optional, may allow a user and/or system to diagnose and/or manage the optical transceiver or various components thereof. Examples of suitable systems include, but are not limited to, host devices, computer systems, manufacturing equipments, testing equipment, and other systems with one or more microprocessors. The term user is intended to include not only those who purchase and use the optical transceiver for its intended use, but also those who actively interact with or use the optical transceiver in the course of manufacture, testing, design, development, etc.

In one or more embodiments of the invention, the management may include a user and/or system specifying or otherwise providing a configuration for the configurable post-amplifier. For example, in one or more embodiments of the invention, a user or system may specify through the interface that a substantially linear amplifier portion of the configurable post-amplifier be used. Repeated re-configuration is also possible. Other ways of configuring the configurable post-amplifier include, but are not limited to, the host device configuring the configurable post-amplifier through the electrical interface 452, and the configurable amplifier being configured during manufacture before final assembly of a transceiver.

Optical transceivers are currently available in a wide variety of form factors, each generally addressing different link parameters and protocols. These form factors are the result of multi-source agreements (MSAs) that generally specify mechanical dimensions and electrical interfaces. An early MSA was the 300-pin MSA, followed by XENPAK, X2/XPAK, SFP, and XFP. Each of the transceivers specified by the MSAs may offer advantages that fit the needs of various systems, supporting different protocols, fiber reaches, and/or power dissipation levels. Modern small form factor (SFF) Optical Transceivers provide high performance integrated duplex data links for bi-directional communication over multimode optical fiber.

Figure 5:
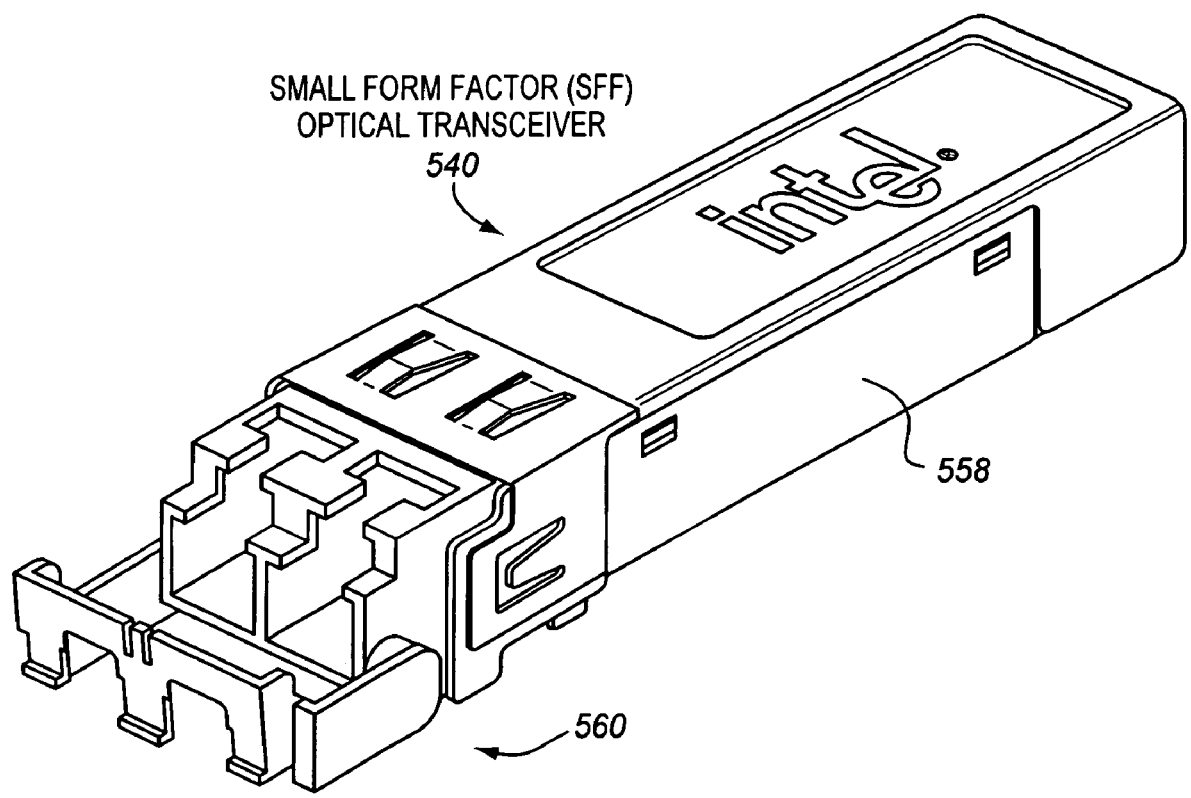
FIG. 5 is a perspective view of an exemplary small form factor (SFF) optical transceiver suitable for one or more embodiments of the invention.

FIG. 5 is a perspective view of an exemplary small form factor (SFF) optical transceiver 540 suitable for one or more embodiments of the invention. As shown, the transceiver may include a housing 558 to house, enclose, or contain electronic and optoelectronic components. Pins, an edge-card connector, or other electrical connectors (not shown, but located on the bottom) may be provided to electrically couple with a circuit board or other signaling medium. The front of the transceiver may include a receptacle portion 560 that is capable of receiving a mating plug or other connector in order to allow optical fibers or other waveguides to communicate with the transceiver. In the illustrated embodiment two receptacles are included, such as, for example, one for a transmitter receptacle and another for a receiver receptacle, although the scope of the invention is not so limited.

One illustrative example of a SFF optical transceiver having certain features similar to the optical transceiver shown in FIG. 5 is the Intel® TXN31115 4/2/1 Gbps small form factor pluggable (SFP) optical transceiver, which is commercially available from Intel Corporation, of Santa Clara, Calif. The TXN31115 optical transceivers are multi-source agreement (MSA) compliant and may provide high performance integrated duplex data links for bi-directional communication over multimode optical fiber. It should be appreciated that the scope of the invention is not limited to such optical transceivers, and that other optical transceivers entirely are also suitable.

Figure 6A:
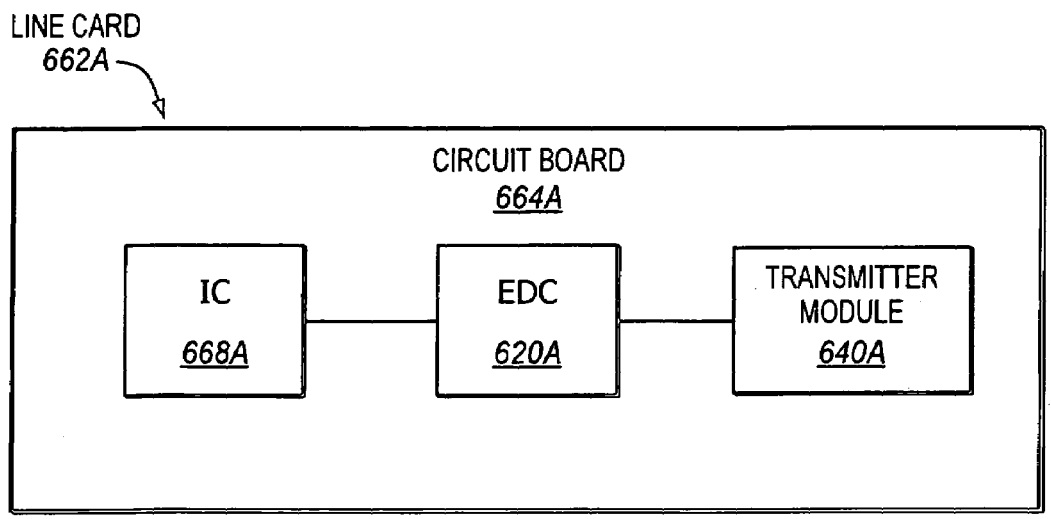
FIGS. 6A-C are block diagrams of line cards that show example locations of an EDC device according to various embodiments of the invention.
Figure 6B:
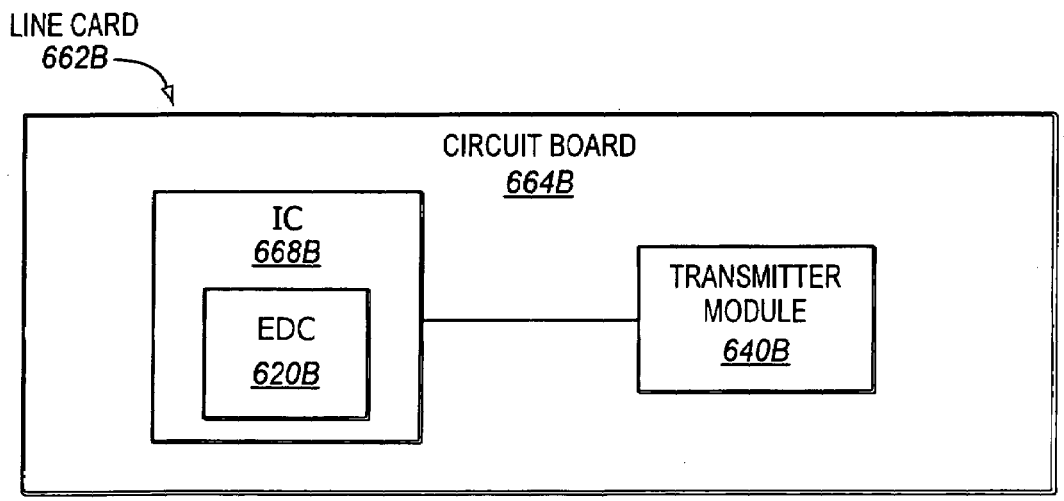
Figure 6C:
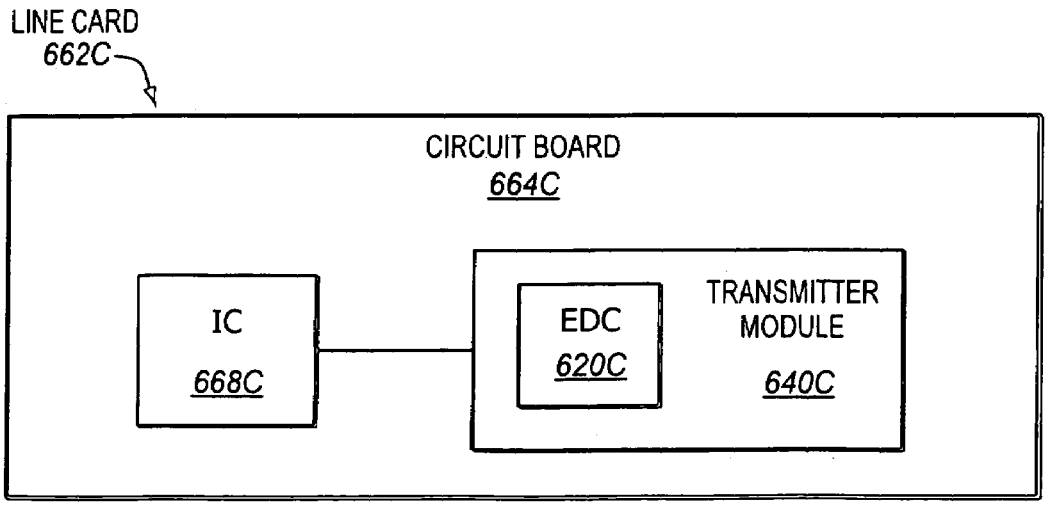

Different locations for the EDC device are possible. FIGS. 6A-C are block diagrams of line cards 662A-C that show example locations of an EDC device 620A-C according to various embodiments of the invention.

Each of the line cards respectively includes a circuit board 664A-C having a transceiver module 640A-C (having a configurable post-amplifier as disclosed herein) and an integrated circuit 668A-C electrically coupled thereto. By way of example, the integrated circuits may include application specific integrated circuits (ASICs). The integrated circuits may perform at least some of the communications processing associated with the operation of the transceiver module. The amount of processing may vary from one implementation to another. In one or more embodiments, the processing may be limited primarily to multiplexing and demultiplexing. Alternatively, the processing may be more in line with a network processor. Such use of a separate integrated circuit may help to allow the transceiver module to be smaller or offer other advantages.

FIG. 6A shows that an EDC circuit or other device 620A may be implemented as an integrated circuit or other device that may be separate from the integrated circuit 668A and transceiver module 640A and separately electrically coupled with the circuit board 664A, according to one or more embodiments of the invention. This may allow commercially available EDC devices to be used or offer other advantages. One example of a suitable EDC device is SCN3142, which is commercially available from Scintera Networks, of San Jose, Calif. Another example of a suitable EDC device is VSC8238, which is commercially available from Vitesse Semiconductor Corporation, of Camarillo, Calif.

FIG. 6B shows that an EDC circuit or other device 620B may be integrated with the integrated circuit 668B, according to one or more embodiments of the invention. This may help to reduce cost, reduce the total footprint of the devices coupled to the circuit board, or offer other advantages.

FIG. 6C shows that an EDC circuit or other device 620C may be integrated with the transceiver module 640C, according to one or more embodiments of the invention. This approach may be relatively less favored in the case of relatively small form factor devices due to space and power dissipation limitations.

Figure 7:
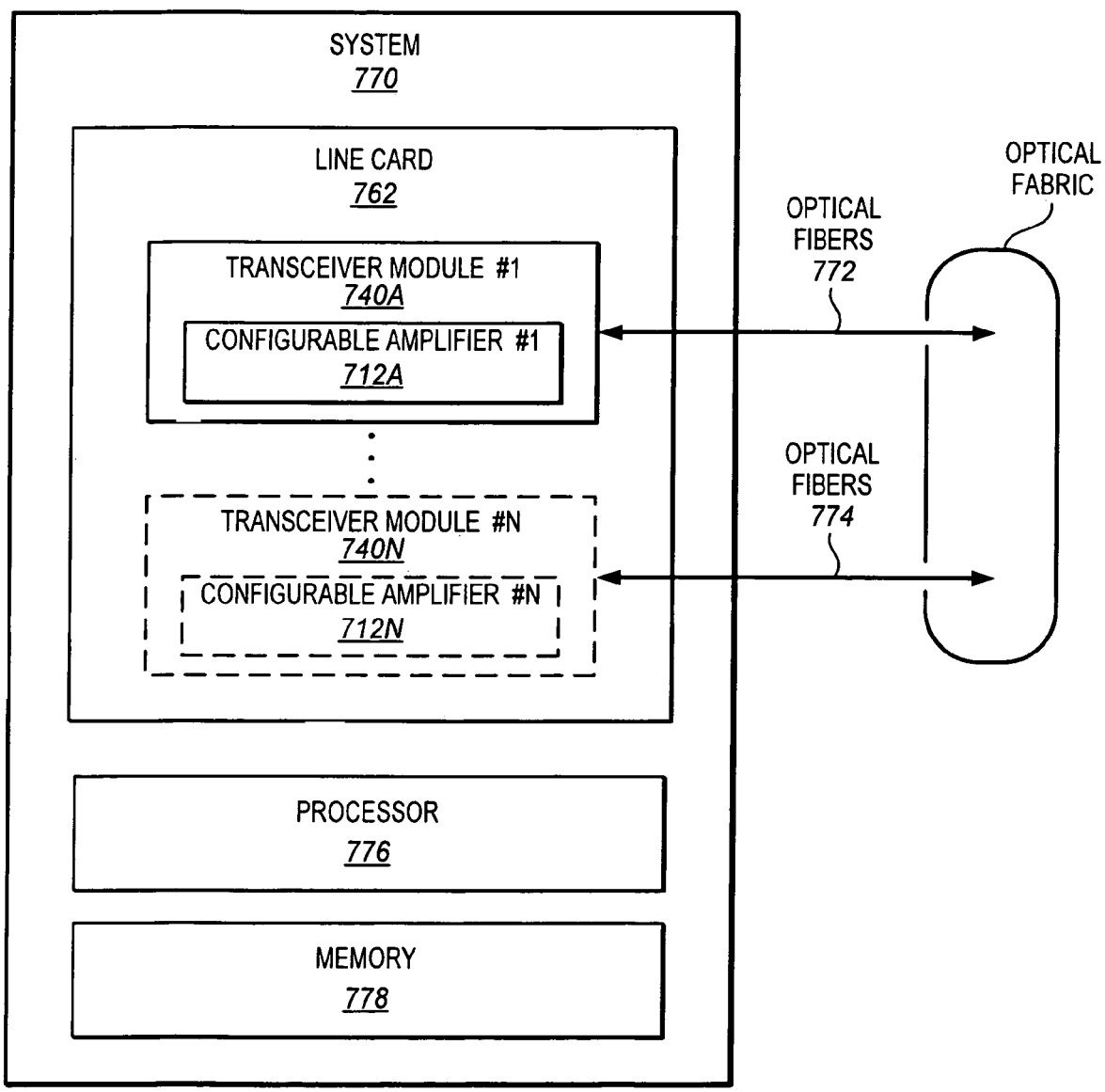
FIG. 7 is a block diagram of a particular example of a network device or system suitable for implementing one or more embodiments of the invention.

FIG. 7 is a block diagram of a particular example of a network device or system 770 suitable for implementing one or more embodiments of the invention. This particular example is to be construed as illustrative, rather than limiting.

The system includes a line card 762. A first transceiver module 740A is electrically coupled with a circuit board of the line card. The first transceiver module has a configurable amplifier 712A. The configurable amplifier may have characteristics and operation as described elsewhere herein. In one or more embodiments, one or any desired number (#N) of additional transceiver modules 740B-N may optionally be electrically coupled with the circuit board. However these are optional and not required. Each of these transceiver modules may potentially have a configurable amplifier 712B-N, which may have characteristics and operation as described herein.

A first set of one or more optical fibers 772 may be optically coupled with the first transceiver module. Likewise, an additional set of one or more optical fibers 774 may be included for each optional additional transceiver module. Examples of suitable types of optical fibers include plastic optical fibers and glass optical fibers. The optical fibers may collectively represent an optical fabric that the system and line card uses to communicate over.

The system may also include other conventional components, such as, for example, at least one processor 776, and at least one memory 778, etc. In various embodiments of the invention, the processor may include a single processor core or multiple processor cores. Processors with multiple cores are used in some, but not all, network devices. In one or more embodiments of the invention, the processor may include a processor of Intel Corporation, of Santa Clara, Calif. Alternatively, other processors may be used. In one or more embodiments of the invention, the memory may include dynamic random access memory (DRAM). DRAM is a type of memory used in some, but not all, network devices.

Various embodiments have been described although other embodiments are contemplated. For example, while configurable post-amplifiers having two different configurations have been shown and described, configurable amplifiers having three or more different configurations are also contemplated. As another example, a configurable amplifier may be used without EDC. Many further alterations are contemplated.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known circuits, structures, devices, and operations have been shown in block diagram form or without detail in order to avoid obscuring the understanding of the description. Where considered appropriate, terminal portions of reference numerals have been repeated among the different figures to indicate corresponding or analogous elements, which may optionally have similar characteristics.

For clarity, in the claims, any element that does not explicitly state "means for" performing a specified function, or "step for" performing a specified function, is not to be interpreted as a "means" or "step" clause as specified in 35 U.S.C. Section 112, Paragraph 6. In particular, any potential use of "step of" in the claims herein is not intended to invoke the provisions of 35 U.S.C. Section 112, Paragraph 6.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

Accordingly, while the invention has been thoroughly described in terms of several embodiments, those skilled in the art will recognize that the invention is not limited to the particular embodiments described, but may be practiced with modification and alteration within the spirit and scope of the appended claims. The description is thus to be regarded as illustrative instead of limiting.

What is claimed is:

1. An apparatus comprising:
   a photodetector to receive light and generate a corresponding electrical current;
   a current-to-voltage converter electrically coupled with an output of the photodetector to receive the current and convert the current to a corresponding voltage; and
   a configurable amplifier coupled with an output of the current-to-voltage converter to receive the voltage, the configurable amplifier capable of being configured to use either a substantially linear amplifier portion or a substantially non-linear amplifier portion to amplify the voltage,
   wherein, if configured to use the substantially linear amplifier portion, the amplified voltage output from the configurable amplifier is to be amplified substantially directly proportionally to the received voltage,
   the substantially non-linear amplifier portion comprising a limiting amplifier portion.

2. The apparatus of claim 1, wherein the configurable amplifier comprises one or more switches to switch between the substantially linear amplifier portion and the substantially non-linear amplifier portion.

3. The apparatus of claim 1, further comprising a controller electrically coupled with the configurable amplifier to configure the configurable amplifier.

4. The apparatus of claim 3, further comprising a digital management interface coupled with the controller to allow a user or system to provide a configuration for the configurable amplifier through the digital management interface.

5. The apparatus of claim 1, further comprising an electronic dispersion compensation (EDC) device coupled with an output of the configurable amplifier.

6. The apparatus of claim 1, wherein the current-to-voltage converter comprises a substantially linear transimpedance amplifier (TIA).

7. The apparatus of claim 1, further comprising:
   an optical transmitter; and
   a multi-source agreement compliant housing containing the optical transmitter, the photodetector, the current-to-voltage converter, and the configurable amplifier.

8. The apparatus of claim 1, wherein the substantially linear amplifier portion comprises a signal strength detector to detect a signal strength of the amplified voltage.

9. The apparatus of claim 1, wherein the amplified voltage has a total harmonic distortion of less than 4% over an input operating current range.

10. The apparatus of claim 1, wherein the substantially linear amplifier portion comprises:
    a signal strength detector to detect an output signal strength from the substantially linear amplifier portion; and
    a comparator to compare the detected output signal strength to a reference signal strength.

11. A method comprising:
    electrically coupling a configurable amplifier between an output of a current-to-voltage converter and an input of an electronic dispersion compensation device; and
    configuring the configurable amplifier to amplify a voltage received from the current-to-voltage converter substantially linearly by amplifying the voltage substantially directly proportionally instead of substantially non-linearly by performing limiting amplification, wherein the configurable amplifier is coupled to output the voltage that has been amplified substantially directly proportionally to the electronic dispersion compensation device.

12. The method of claim 11, wherein configuring the configurable amplifier comprises configuring one or more switches to select a substantially linear amplifier portion instead of a substantially non-linear amplifier portion.

13. The method of claim 11, wherein configuring the configurable amplifier comprises providing a configuration through a digital management interface of an optical transceiver module.

14. The method of claim 11, wherein configuring the configurable amplifier comprises configuring the configurable amplifier based, at least in part, on at least one of a link distance corresponding to the configurable amplifier and a dispersion characteristic of an optical fiber corresponding to the configurable amplifier.

15. The method of claim 11, wherein configuring comprises configuring the configurable amplifier not to use a limiting amplifier portion.

16. The method of claim 11, further comprising enclosing an optical transmitter, the configurable amplifier, the current-to-voltage converter, and the electronic dispersion compensation device within a multi-source compliant housing.

17. The method of claim 11, further comprising amplifying the voltage substantially linearly, in which amplifying the voltage substantially linearly includes detecting a strength of the amplified voltage.

18. A system comprising:
    one or more glass optical fibers to convey light; and
    an optical receiver coupled with the one or more optical fibers, the optical receiver including:
    a photodetector to receive the light from the one or more optical fibers and generate a corresponding electrical current;
    a current-to-voltage converter electrically coupled with an output of the photodetector to receive the current and convert the current to a corresponding voltage; and
    a configurable amplifier coupled with an output of the current-to-voltage converter to receive the voltage, the configurable amplifier capable of being configured to use either a substantially linear amplifier portion or a substantially non-linear amplifier portion to amplify the voltage,
    wherein, if configured to use the substantially linear amplifier portion, the amplified voltage to be output from the configurable amplifier is to be amplified substantially directly proportionally to the received voltage, the substantially non-linear amplifier portion comprising a limiting amplifier portion.

19. The system of claim 18, wherein the configurable amplifier comprises one or more switches to switch between the substantially linear amplifier portion and the substantially non-linear amplifier portion.

20. The system of claim 18, further comprising an electronic dispersion compensation (EDC) device coupled with an output of the configurable amplifier.

21. An apparatus comprising:
a transmitter driver capable of being electrically coupled with an optical transmitter to drive the optical transmitter; and
a configurable amplifier capable of being electrically coupled with a transimpedance amplifier (TIA) to receive a voltage from the TIA, the configurable amplifier capable of being configured to use either a substantially linear amplifier portion capable of amplifying the voltage received from the TIA substantially directly proportionally and outputting the directly proportionally amplified voltage from the configurable amplifier or a limiting amplifier portion to amplify the voltage received from the TIA.

22. The apparatus of claim 21, wherein the configurable amplifier comprises one or more switches to switch between the substantially linear amplifier portion and the substantially non-linear amplifier portion.

23. The apparatus of claim 21, wherein the transmitter driver and the configurable amplifier reside on a single integrated circuit.

24. The apparatus of claim 21, further comprising an electronic dispersion compensation (EDC) device coupled with an output of the configurable amplifier to receive the directly proportionally amplified voltage.

* * * * *

UNITED STATES PATENT AND TRADEMARK OFFICE
CERTIFICATE OF CORRECTION

| | | |
|---|---|---|
| PATENT NO. | : 7,912,383 B2 | Page 1 of 1 |
| APPLICATION NO. | : 11/647844 | |
| DATED | : March 22, 2011 | |
| INVENTOR(S) | : Cheng et al. | |

It is certified that error appears in the above-identified patent and that said Letters Patent is hereby corrected as shown below:

IN THE CLAIMS:

In column 12, at line 43, claim 16, after, -- multi-source -- insert -- agreement --.

Signed and Sealed this
Ninth Day of August, 2011

David J. Kappos
*Director of the United States Patent and Trademark Office*